United States Patent
Yeon et al.

(10) Patent No.: US 12,464,912 B2
(45) Date of Patent: Nov. 4, 2025

(54) STRETCHABLE DISPLAY APPARATUS

(71) Applicant: LG Display Co., Ltd., Seoul (KR)

(72) Inventors: Deuk Ho Yeon, Paju-si (KR); Sun Wook Ko, Paju-si (KR); Kum Mi Oh, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 503 days.

(21) Appl. No.: 18/012,495

(22) PCT Filed: May 6, 2021

(86) PCT No.: PCT/KR2021/005670
§ 371 (c)(1),
(2) Date: Dec. 22, 2022

(87) PCT Pub. No.: WO2022/005008
PCT Pub. Date: Jan. 6, 2022

(65) Prior Publication Data
US 2023/0255068 A1   Aug. 10, 2023

(30) Foreign Application Priority Data
Jul. 2, 2020   (KR) ........................ 10-2020-0081397

(51) Int. Cl.
*H10K 59/131*    (2023.01)
*H10K 59/82*     (2023.01)
*H10K 77/10*     (2023.01)
*H10K 102/00*    (2023.01)

(52) U.S. Cl.
CPC ........... *H10K 59/131* (2023.02); *H10K 59/82* (2023.02); *H10K 77/111* (2023.02); *H10K 2102/311* (2023.02)

(58) Field of Classification Search
None
See application file for complete search history.

(56) References Cited

U.S. PATENT DOCUMENTS

| 9,841,548 B2 * | 12/2017 | Kim ..................... G06F 1/1643 |
| 2014/0232956 A1 | 8/2014 | Kwon et al. |
| 2016/0111481 A1 | 4/2016 | Jeong et al. |

(Continued)

FOREIGN PATENT DOCUMENTS

| KR | 10-2014-0103025 A | 8/2014 |
| KR | 10-2016-0047064 A | 5/2016 |

(Continued)

*Primary Examiner* — Kyoung Lee
(74) *Attorney, Agent, or Firm* — Birch, Stewart, Kolasch & Birch, LLP (57) ABSTRACT

A stretchable display apparatus can include a transistor substrate having a plurality of first regions corresponding to a plurality of pixel substrates disposed on a base substrate, and a second region between the plurality of first regions; a connection line disposed in the second region, the connection line electrically connecting two adjacent pixel substrates among the plurality of pixel substrates; and a reduction pattern disposed in the second region. Also, the reduction pattern can include a first reduction pattern overlapping with the connection line; and a second reduction pattern spaced apart from the first reduction pattern by a first distance and having a shape corresponding to at least a portion of the connection line.

20 Claims, 7 Drawing Sheets

(56) References Cited

U.S. PATENT DOCUMENTS

2016/0211483 A1     7/2016   Kwon
2020/0035778 A1*   1/2020   Kim .................. H10K 59/1275
2020/0037442 A1     1/2020   Keum et al.

FOREIGN PATENT DOCUMENTS

| KR | 10-2016-0088522 A | 7/2016 |
| KR | 10-2020-0012255 A | 2/2020 |
| KR | 10-2020-0012419 A | 2/2020 |

* cited by examiner

STRETCHABLE DISPLAY APPARATUS

CROSS-REFERENCE TO RELATED APPLICATION

This application is the National Phase of PCT International Application No. PCT/KR2021/005670, filed on May 6, 2021, which claims priority under 35 U.S.C. 119(a) to Korean Patent Application No. 10-2020-0081397, filed in the Republic of Korea on Jul. 2, 2020, the entireties of all these applications are hereby expressly incorporated by reference into the present application.

BACKGROUND

Technical Field

The present disclosure relates to a stretchable display apparatus.

Discussion of the Related Art

As information technology advances, the market for display apparatuses, which are connection mediums connecting a user to information, is growing. Therefore, the use of display apparatuses, such as organic light emitting display (OLED) apparatuses, liquid crystal display (LCD) apparatuses, and plasma display panel (PDP), is increasing.

Recently, as technology associated with display apparatuses advances, flexible display apparatuses capable of being folded, bent or changed to a roll shape are being researched and developed. The flexible display apparatuses may be implemented as various types such as bendable display apparatuses, foldable display apparatuses, and rollable display apparatuses. Furthermore, research and development are being actively done on stretchable display apparatuses capable of being stretched in a widthwise or lengthwise direction.

Such stretchable display apparatuses may be applied to televisions (TVs), vehicle displays, and wearable devices as well as mobile devices such as smartphones and tablet personal computers (PCs), and the application field thereof is expanding. However, stretchable display apparatuses may experience a considerable amount of stress in certain areas, which can cause cracks and disconnect various connection structures or damage certain elements, which can reduce the reliability of a display panel and shorten the lifespan of the device.

SUMMARY OF THE DISCLOSURE

The present disclosure can provide a stretchable display apparatus in which a reduction pattern is disposed on a connection line electrically connecting pixel substrates to decrease a stress occurring in a bent region of the connection line, thereby enhancing the reliability of a display panel.

Technical Solution

To achieve these objects and other advantages and in accordance with the purpose of the disclosure, as embodied and broadly described herein, a stretchable display apparatus includes a transistor substrate including a first region, where a plurality of pixel substrates are disposed on a base substrate, and a second region where a surface of the base substrate is exposed between a plurality of first regions, a connection line connecting each of the plurality of pixel substrates to an adjacent pixel substrate and extending on the plurality of pixel substrates, and accordingly, disposed in the second region, and a reduction pattern disposed apart from the connection line in the second region. Here, the reduction pattern can include a first reduction pattern disposed in the second region to overlap the connection line disposed in the second region and a second reduction pattern disposed apart from the first reduction pattern by a first interval to have a shape corresponding to a partial region along a shape of the connection line.

Moreover, each of the connection line and the first reduction pattern can include a first shape region disposed in a wavy shape and a second shape region disposed in a rectilinear shape, the first shape region and the second shape region being provided as one body, and the second reduction pattern can be disposed in a shape corresponding to an outer circumference surface of the first shape region.

Moreover, a third reduction pattern disposed to correspond to an inner circumference surface of the first shape region can be further provided.

Here, the third reduction pattern can be disposed in one shape selected from among an oval pattern, a semicircular pattern, a line pattern, and a combination shape thereof, which have an island shape along the inner circumference surface of the first shape region.

The first to third reduction patterns can include the same material.

The second reduction pattern can further include a connection pattern connecting the second reduction pattern to the third reduction pattern.

Here, one side of an end portion of the third reduction pattern can be disposed adjacent to the inner circumference surface of the first shape region, and the other side of the end of the third reduction pattern can be disposed adjacent to a boundary portion between the first shape region and the second shape region, an end portion of the other side of the third reduction pattern can be connected to the connection pattern, and end portions of one side and the other side of the connection pattern can connect end portions of a plurality of second reduction patterns.

The first reduction pattern can be disposed to contact a side surface of a corresponding pixel substrate of the plurality of pixel substrates.

Moreover, the first reduction pattern can be disposed to have a thickness which is less than or equal to a thickness of each of the plurality of pixel substrates.

The reduction pattern can include one or more materials selected from among polyimide (PI)-based resin, epoxy-based resin, and a compound thereof each having the same flexibility as flexibility of the base substrate.

The first interval can be within a range of about 0.01 µm to about 4 µm (e.g., 2 µm).

Moreover, the third reduction pattern and the connection line can be disposed apart from each other by a second interval, and the second interval is within a range of about 0.01 µm to about 4 µm (e.g., 2 µm).

The connection line can be provided in plurality, and the first reduction pattern can be disposed to correspond to each of the plurality of connection lines.

The transistor substrate according to an embodiment of the present disclosure can include a pixel substrate disposed in only a first region of the base substrate to have rigidity which is greater than rigidity of the base substrate, a buffer layer disposed on each of the plurality of pixel substrates, a transistor including a gate electrode disposed on the buffer layer, a gate line provided as one body with the gate electrode, a gate insulation layer disposed on the gate electrode, an active layer disposed on the gate insulation layer, an interlayer insulation layer disposed on the active layer, a source/drain electrode disposed on the interlayer insulation layer, a data line provided as one body with the source/drain electrode, and a planarization layer disposed on the source/drain electrode and the data line, a data line pad and a gate line pad disposed on the planarization layer and respectively connected to the data line and the gate line, and an organic light emitting device connected to the transistor, and the connection line can include a first connection line connected to the gate line pad to travel in a widthwise direction of the plurality of pixel substrates and a second connection line connected to the data line pad to travel in a lengthwise direction of the plurality of pixel substrates.

The buffer layer can include one material selected from among silicon rubber including polydimethylsiloxane (PDMS), elastomer including polyurethane (PU), and a compound thereof.

The organic light emitting device according to an embodiment of the present disclosure can include an anode connected to the transistor and disposed on the planarization layer, a bank including an opening portion exposing a portion of the anode and a contact hole exposing a portion of each of the data line pad and the gate line pad, an organic light emitting layer disposed on the anode exposed by the bank, and a cathode disposed on the organic light emitting layer, and the first connection line and the second connection line, respectively connected to the gate line pad and the data line pad each exposed through the contact hole, can be disposed on the bank.

Here, the gate line pad, the data line pad, and the anode can include the same material.

Moreover, the first connection line and the second connection line can be disposed to contact a top surface and a side surface of the bank 270 disposed on the plurality of pixel substrates, the planarization layer, the interlayer insulation layer, the gate insulation layer, the buffer layer, and side surfaces of the plurality of pixel substrates and to extend to a top surface of the first reduction pattern.

Specific details of other embodiments are included in the detailed description and drawings.

Advantages of the Invention

In the stretchable display apparatus according to the embodiments of the present disclosure, a reduction pattern can be disposed adjacent to a connection line electrically connecting pixel substrates, thereby decreasing a stress occurring in a bent region of the connection line.

Moreover, in the stretchable display apparatus according to the embodiments of the present disclosure, by using the reduction pattern disposed adjacent to the connection line, an elongation characteristic can be secured and a crack of the connection line can be prevented, thereby enhancing the reliability of a display panel.

The effects according to the present disclosure are not limited to the above examples, and other various effects can be included in the specification.

DETAILED DESCRIPTION OF THE EMBODIMENTS

Hereinafter, exemplary embodiments of the present disclosure will be described in detail with reference to the accompanying drawings. In the specification, in adding reference numerals for elements in each drawing, it should be noted that like reference numerals already used to denote like elements in other drawings are used for elements wherever possible. In the following description, when the detailed description of the relevant known function or configuration is determined to unnecessarily obscure the important point of the present disclosure, the detailed description will be omitted. In describing embodiments, the same elements are representatively described at a beginning part.

It will be understood that, although the terms including ordinal numbers such as "first" and "second" can be used herein to describe various elements, these elements should not be limited by these terms. These terms are only used to distinguish one element from another.

A flexible display apparatus according to the present disclosure can be a display apparatus where a display device is provided on a flexible substrate. Examples of the flexible display apparatus can include an organic light emitting display apparatus, a liquid crystal display (LCD) apparatus, and an electrophoresis display apparatus, but in the present disclosure, an organic light emitting display apparatus will be described for example. The organic light emitting display apparatus can include an organic light emitting layer which is disposed between a first electrode (an anode) and a second electrode (a cathode) and includes an organic material. Accordingly, the organic light emitting display apparatus can be a self-emitting display apparatus where a hole supplied from the first electrode and an electron supplied from the second electrode are combined in the organic light emitting layer to generate an exciton which is a hole-electron pair, and light is emitted with energy generated based on the shift of the exciton to a ground state.

The flexible display apparatus according to the present disclosure can be a stretchable display apparatus. The stretchable display apparatus can be referred to as a display apparatus for displaying an image despite being bent or stretched. The stretchable display apparatus can have flexibility which is higher than general display apparatuses.

Therefore, a user can allow the stretchable display apparatus to be bent or stretched, and thus, a shape of the stretchable display apparatus can be freely changed based on the manipulation of the user. For example, when the user pulls an end of the stretchable display apparatus with a hand of the user, the stretchable display apparatus can be stretched by a force of the user. Alternatively, when the user places the stretchable display apparatus on a non-flat wall, the stretchable display apparatus can be disposed to be bent along a shape of a surface of the wall. Also, when the force applied by the user is released, the stretchable display apparatus can return to an original shape again.

Figure 1:
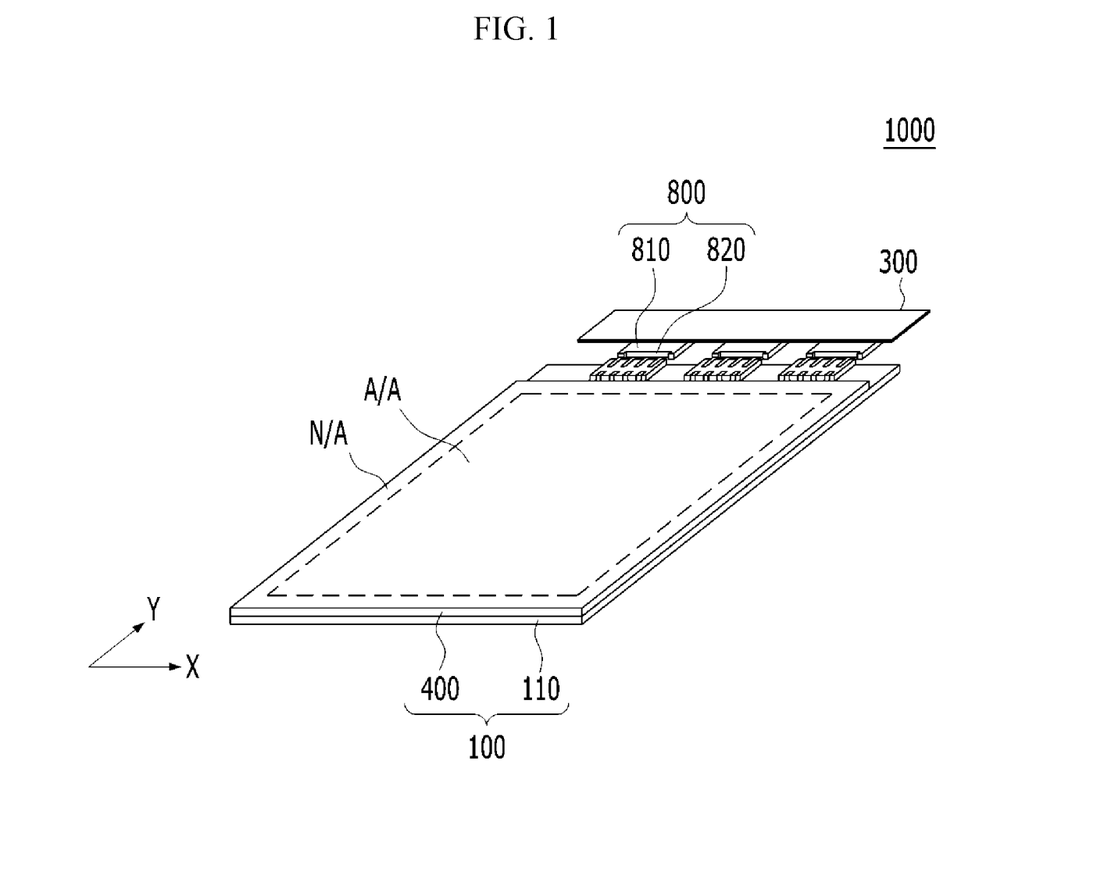
FIG. 1 is a perspective view of a stretchable display apparatus according to an embodiment of the present disclosure.
Figure 2:
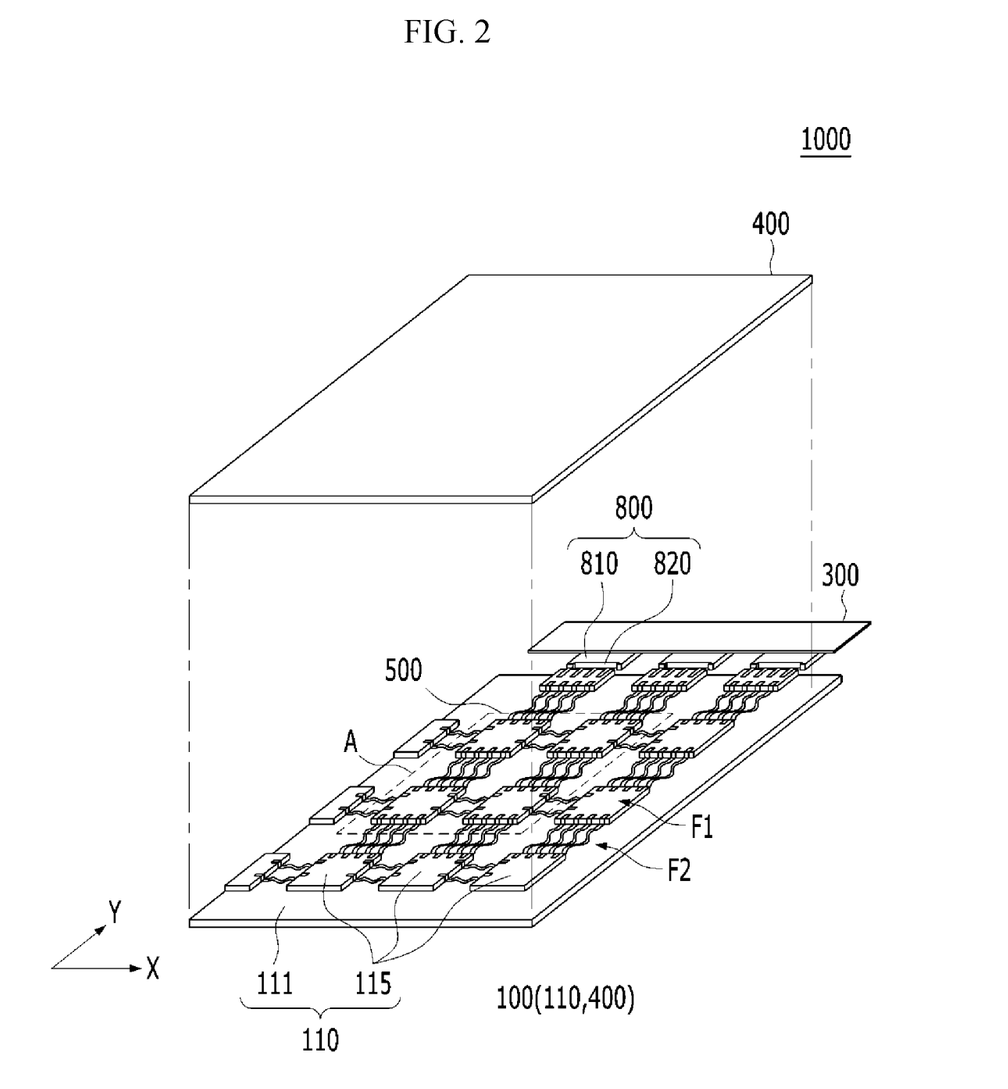
FIG. 2 is an exploded perspective view of a stretchable display apparatus according to an embodiment of the present disclosure.

FIG. 1 is a perspective view of a stretchable display apparatus 1000 according to an embodiment of the present disclosure, and FIG. 2 is an exploded perspective view of the stretchable display apparatus 1000 according to an embodiment of the present disclosure.

As illustrated in FIGS. 1 and 2, the stretchable display apparatus 1000 according to an embodiment of the present disclosure can include a display panel 100, a connection member 800, and a flexible printed circuit board (FPCB) 300.

The display panel 100 can be elastic in one of a first direction X and a second direction Y. The display panel 100 can be two-dimensionally elastic in the first direction X and the second direction Y. Here, the first direction X and the second direction Y can configure a plane of the stretchable display apparatus 1000, and the second direction Y can be a direction vertical to the first direction X.

The display panel 100 can include a transistor substrate 110 and an encapsulation film 400. Also, the display panel 100 can further include a polarizer which can be disposed under the transistor substrate 110 or on the encapsulation film 400.

The encapsulation film 400 can be disposed to overlap the transistor substrate 110 and can be a substrate for protecting some elements of the display panel 100. The encapsulation film 400 can be a flexible substrate and can include a material which is bendable or flexible. For example, the encapsulation film 400 can include a material having elasticity, but is not limited thereto.

The display panel 100 can include a display area A/A displaying an image and a non-display area N/A which is disposed to surround the display area A/A in a region adjacent to the display area A/A.

The display area A/A can include a plurality of pixels each including a plurality of subpixels. Each of the plurality of subpixels can include a light emitting device and can be connected to various lines, such as a gate line, a data line, a high level power line, a low level power line, and a reference voltage line.

The non-display area N/A can be an area which is adjacent to the display area A/A and surrounds the display area A/A and can be an area which does not display an image. A circuit unit and a line, which is disposed to extend from a line disposed in the display area A/A, can be disposed in the non-display area N/A. For example, a plurality of bonding pads or signal pads can be disposed in the non-display area N/A, and each of the pads can be connected to each of the plurality of subpixels of the display area A/A.

The connection member 800 connected to other elements in the non-display area N/A and disposed outside the non-display area N/A can transfer a signal, input from the FPCB 300, to the display panel 100. That is, the connection member 800 can be a connection film which is disposed between the display panel 100 and the FPCB 300 and electrically connects the display panel 100 to the FPCB 300.

The connection member 800 can be bonded to the plurality of bonding pads disposed in the non-display area N/A and can supply a source voltage, a data voltage, and a gate voltage to each of the plurality of subpixels of the display area A/A through the bonding pad.

The connection member 800 can include a base film 810, a driving circuit chip 820 disposed on the base film 810, and a plurality of conductive lines which are disposed on the base film 810 and transfer a driving signal or a control signal.

The base film 810 can be a layer which supports the driving circuit chip 820. The base film 810 can include an insulating material having flexibility, and for example, can include polyimide (PI)-based resin or epoxy-based resin.

The driving circuit chip 820 can process data for processing an image input from the outside and a driving signal for processing the data. In FIGS. 1 and 2, the driving circuit chip 820 is illustrated as being mounted as a chip-on film (COF) type, but is not limited thereto and can be mounted as a type such as a chip-on glass (COG) type or a tape carrier package (TCP) type.

Also, the connection member 800 can further include a plurality of conductive lines which are disposed on at least one surface of the base film 810. The plurality of conductive lines can transfer image data and driving data, input from the FPCB 300, to the driving circuit chip 820 and can transfer a data signal and a driving control signal, output from the driving circuit chip 820, to the display panel 100. The conductive lines can each have a wavy shape, a zig-zag shape or a diamond shape, to minimize damage in elongating.

The stretchable display apparatus 1000 according to an embodiment of the present disclosure can divide the base film 810 of the connection member 800 to correspond to each of the plurality of conductive lines disposed on the base film 810 in a one-to-one relationship, and thus, when the display panel 100 elongates, the connection member 800 can be deformed to correspond thereto, thereby minimizing a stress of the connection member 800 caused by the elongation of the display panel 100.

The transistor substrate 110 can be a substrate which supports some elements disposed in the display panel 100. The transistor substrate 110 can include a base substrate 111, which includes a flexible material and is bendable or extendable, and a pixel substrate 115 of the transistor substrate 110 which is disposed on the base substrate 111 and includes a rigid material which is more ridged than that of the transistor substrate 110 (e.g., the transistor substrate 110 can be more flexible than the individual pixel substrates 115).

Here, the pixel substrate 115 of the transistor substrate 110 may not be disposed on a front surface of the base substrate 111 of the transistor substrate 110 and can be selectively disposed in an island shape in a predetermined region, and adjacent pixel substrates 115 can be disposed apart from each other. For example, a plurality of pixel substrates 115 can be arranged in a grid or an array format.

Moreover, a first region F1 and a second region F2 having different moduli of elasticity can be defined in the display area A/A and the non-display area N/A.

Here, in the display area A/A, the first region F1 can be a region where each of a plurality of pixels is disposed, and the second region F2 can be a region where a plurality of connection lines 500 electrically connecting the pixels are disposed. In detail, the first region F1 can be a region where the pixel substrate 15 is disposed, and the second region F2 can be a region where a surface of the base substrate 111 is exposed because the pixel substrate 115 is not disposed in the second region F2 (e.g., the second region F2 can refer to the space between two adjacent first regions F1).

Moreover, in the non-display area N/A, the first region F1 can be a region where the bonding pad electrically connected to the connection member 800 or the signal pad or the circuit unit applying a driving signal to each of the plurality of pixels is disposed, and the second region F2 can be a region where a connection line(s) 500 disposed in the display area A/A is disposed to extend.

The connection line(s) 500 can have a wavy shape, a zig-zag shape or a diamond shape, to minimize damage in elongating. For example, connection line(s) 500 can have a form that includes alternating curved portions.

In the stretchable display apparatus 1000 according to an embodiment of the present disclosure, in a situation where a plurality of connection lines 500 are disposed in the second region F2 of the base substrate 111 to connect the pixel substrates 115, the connection line 500 can be deformed to correspond thereto, thereby minimizing a stress of the connection line 500 caused by the elongation of the display panel 100.

Hereinafter, the stretchable display apparatus 1000 according to an embodiment of the present disclosure will be described in more detail. Particularly, a structure of the stretchable display panel 100 among the elements of the stretchable display apparatus 1000 will be described in more detail.

Figure 3:
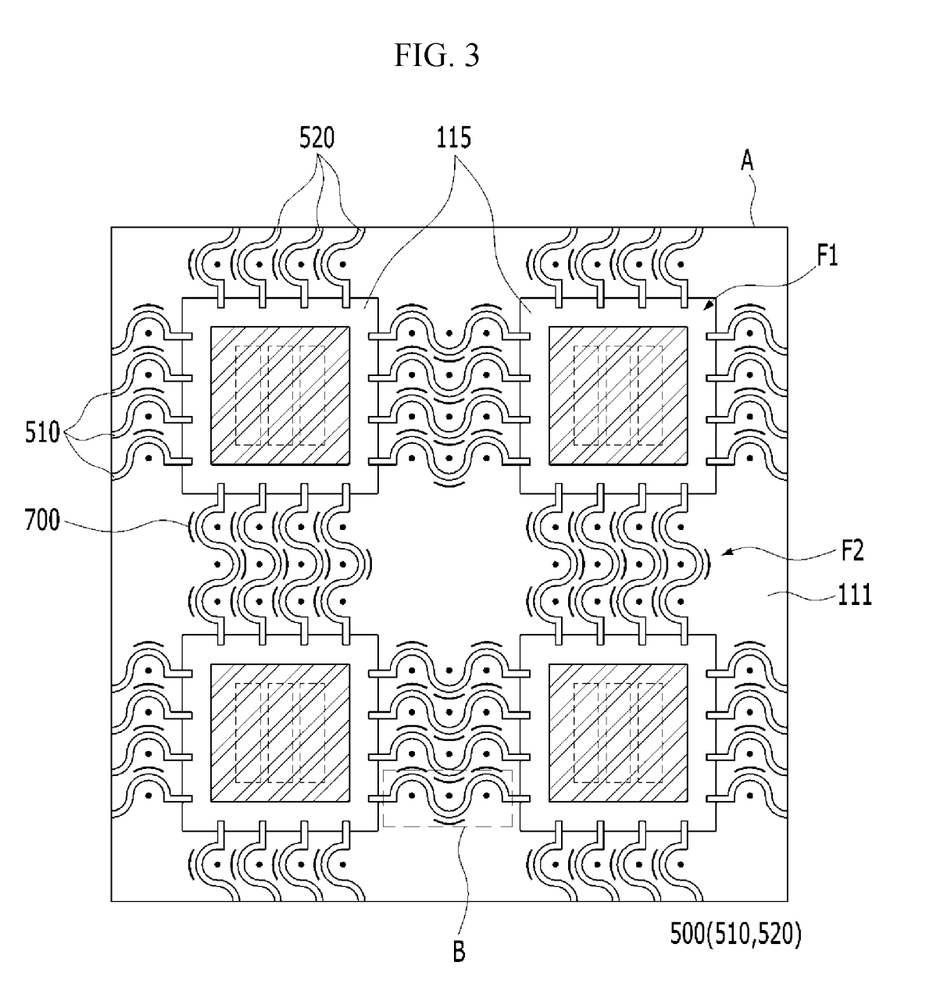
FIG. 3 is an enlarged plan view illustrating the enlargement of a region A of FIG. 2 according to an embodiment of the present disclosure.
Figure 4:
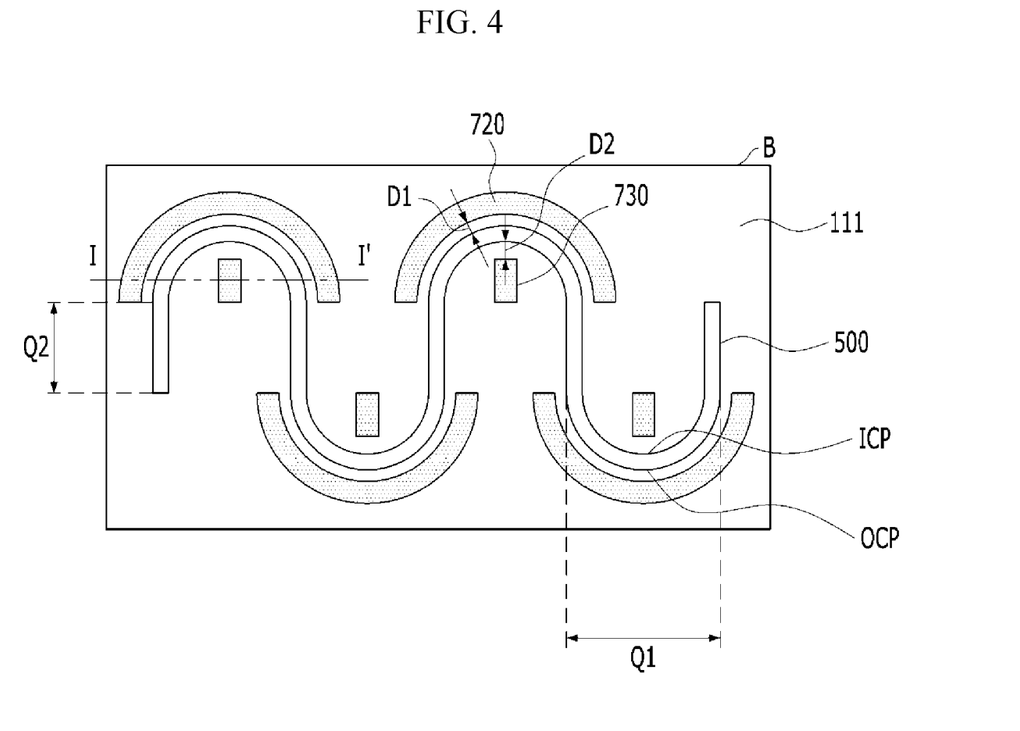
FIG. 4 is an enlarged plan view illustrating the enlargement of a region B of FIG. 3 according to an embodiment of the present disclosure.
Figure 5:
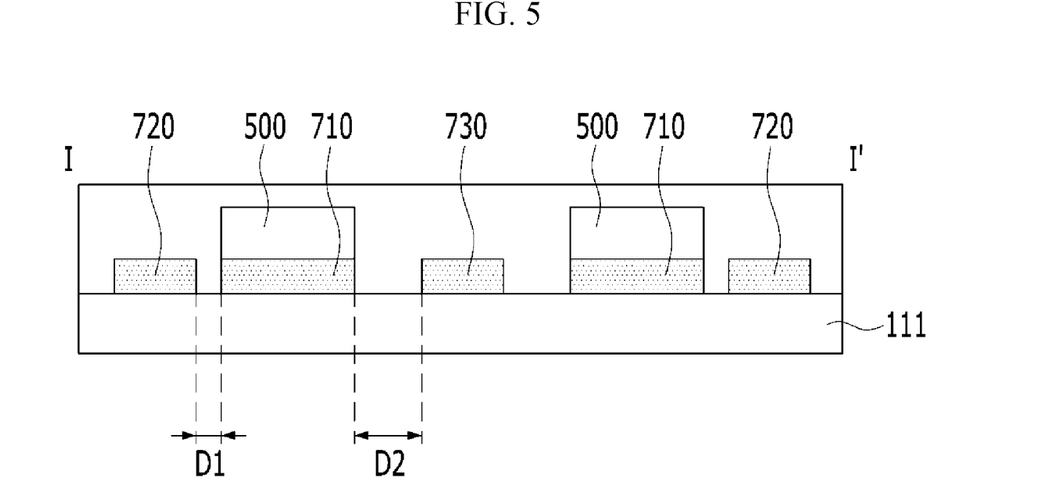
FIG. 5 is a cross-sectional view taken along line I-I' of FIG. 4 according to an embodiment of the present disclosure.

FIG. 3 is an enlarged plan view illustrating the enlargement of a region A of FIG. 2, FIG. 4 is an enlarged plan view illustrating the enlargement of a region B of FIG. 3, and FIG. 5 is a cross-sectional view taken along line I-I' of FIG. 4.

As illustrated in FIGS. 3 to 5, a transistor substrate 110 of a stretchable display apparatus 1000 according to an embodiment of the present disclosure can include a base substrate 111, a plurality of pixel substrates 115, a connection line(s) 500, and a reduction pattern 700.

The base substrate 111 can be a substrate which supports and protects some elements of the stretchable display apparatus 1000. The base substrate 111 can be a flexible substrate and can include an insulating material which is bendable or flexible. For example, the base substrate 111 can include silicon rubber, such as polydimethylsiloxane (PDMS), or elastomer such as polyurethane (PU). However, a material of the base substrate 111 is not limited thereto.

The base substrate 111 can have a modulus of elasticity of several MPa to hundreds MPa, and an elongation failure rate thereof can be 100% or more. A thickness of the base substrate 111 can be about 10 μm to about 1 mm (e.g., 0.5 mm), but is not limited thereto.

A plurality of pixel substrates 115 can be disposed on the base substrate 111. The plurality of pixel substrates 115 can each be a rigid substrate having rigidity compared to the base substrate 111 and can be disposed apart from one another in a first region F1 of the base substrate 111. In more detail, the elasticity of the plurality of pixel substrates 115 can be less in than the elasticity of the base substrate 111 and can have a rigid characteristic (e.g., the base substrate 111 can be more flexible than the plurality of pixel substrates 115).

The modulus of elasticity of the plurality of pixel substrates 115 can be 1,000 or more higher than the modulus of elasticity of the base substrate 111. The plurality of pixel substrates 115 can include a plastic material having flexibility, and for example, can include PI-based resin or epoxy-based resin.

As described above, the base substrate 111 and the plurality of pixel substrates 115 can have different rigidities, and thus, the transistor substrates 110 can have a different modulus of elasticity. Therefore, the transistor substrate 115 of the stretchable display apparatus according to an embodiment of the present disclosure can include the first region F1 and a second region F2, which have different elastic moduli.

In more detail, the first region F1 can be a region where the pixel substrate 115 is disposed, and the second region F2 can be a region where the pixel substrate 115 is not disposed, such as an area between adjacent pixel substrates 115. The first region F1 can have a modulus of elasticity which is higher than that of the second region F2. Here, modulus can be an elastic coefficient representing a rate which is deformed by a stress with respect to a stress applied to a substrate, and when modulus is relatively high, rigidity can be relatively high. For example, the first region F1 can be more resistant to deformation than the second region F2.

Therefore, the first region F1 can be a rigid region having rigidity which is greater than that of the second region F2. Therefore, a pixel PX including a plurality of subpixels SPX for displaying an image can be disposed in the first region F1 (e.g., each of the plurality of pixel substrates 115). A detailed description of a structure of each subpixel SPX will be described below with reference to FIG. 6.

The connection line 500 can be disposed between the plurality of pixel substrates 115 (e.g., in the second region F2). The connection line 500 can be disposed between pads or lines disposed on the plurality of pixel substrates 115 and can electrically connect the pads or the lines.

The connection line 500 can include a first connection line 510 and a second connection line 520. The first connection line 510 can be a line which is disposed in an x-axis direction in the display panel 100, and the second connection line 520 can be a line which is disposed in a y-axis direction in the display panel 100.

In FIG. 3, the connection line 500 is illustrated as having a wavy shape, but is not limited thereto and can be disposed in a zig-zag shape or a diamond shape to prevent the damage of the connection line 500 when the display panel 100 is elongating.

In general organic light emitting display apparatuses, various lines, such as a plurality of gate lines and a plurality of data lines, can be disposed to extend between a plurality of subpixels, and a plurality of subpixels can be connected to one signal line. Therefore, in the general organic light emitting display apparatuses, various lines, such as a gate line, a data line, a high level power line, a low level power line, and a reference voltage line, can extend from one side of an organic light emitting display apparatus to the other side thereof without disconnection, on a substrate.

In the stretchable display apparatus 1000 according to an embodiment of the present disclosure, various lines, such as a gate line, a data line, a high level power line, a low level power line, and a reference voltage line, each including a metal material can be disposed on only the plurality of pixel substrates 115.

That is, in the stretchable display apparatus 1000 according to an embodiment of the present disclosure, various lines including a metal material can be disposed on only the plurality of pixel substrates 115 and may not be provided to contact the base substrate 111. Therefore, the various lines can be patterned to correspond to the plurality of pixel substrates 115 and can be discontinuously disposed.

In the stretchable display apparatus 1000 according to an embodiment of the present disclosure, pads or lines on two pixel substrates 115 adjacent to each other can be connected to each other by the connection line 500, to connect the discontinuous lines form on the plurality of pixel substrates 115.

That is, the connection line 500 can electrically connect between two adjacent pixel substrates 115 having an island shape. For example, a gate line can be disposed in each of a plurality of pixel substrates 115 disposed adjacent to one another in the x-axis direction, and a gate line pad can be disposed on each of the pixel substrates 115 at both ends of the gate line.

Here, a plurality of gate line pads can be electrically connected to one another by the connection line 500 disposed between one pixel substrate 115 and another pixel substrate 115 adjacent to the one pixel substrate 115. Also, the connection line extending in the x-axis direction can function as a gate line for transferring a gate signal.

That is, as illustrated in FIG. 3, the first connection line 510 can function as a gate line, but is not limited thereto and can also function as a low level power line. In other words, the connection line 500 can be provided in plurality and can function as a low level power line and a gate line.

The second connection line 520 can connect pads or lines on two pixel substrates 115 disposed adjacent to each other among a plurality of pads or lines on a plurality of pixel substrates 115 disposed adjacent to one another in the y-axis direction. The second connection line 520 can be provided in plurality and can function as a data line, a high level power line, and a gate line, but is not limited thereto.

At least one of the first connection line 510 and the second connection line 520 of the connection line 500 can include at least one material, selected from among the group consisting of molybdenum (Mo), aluminum (Al), chromium (Cr), gold (Au), titanium (Ti), nickel (Ni), neodymium (Nd), and copper (Cu), or an alloy thereof.

The stretchable display apparatus 1000 according to an embodiment of the present disclosure can include the reduction pattern 700 disposed in the second region F2 of the transistor substrate 110.

The reduction pattern 700 can be disposed in the second region F2 of the base substrate 111 and can include a first reduction pattern 710 disposed to overlap with the connection line 500 and a second reduction pattern 720 which is spaced apart from the first reduction pattern 710 by a first interval D1 and is disposed in a shape corresponding to a partial region along a shape of the connection line 500.

In detail, referring to FIGS. 4 and 5, the first reduction pattern 710 can be disposed between the base substrate 111 and the connection line 500. In other words, the first reduction pattern 710 can be disposed in the same shape as that of the connection line 500 in the second region F2, but is not limited thereto and can be disposed to have a wider area than a width of the connection line 500 depending on the situation.

The first reduction pattern 710 and the connection line 500 can include a first shape region Q1 disposed in a wavy shape or as a curved portion, and a second shape region Q2 disposed in a rectilinear shape, such as having a straight portion. The first shape region Q1 and the second shape region Q2 can be formed as one body and can be alternatingly arranged to form a repeating pattern including a curved portion and a straight portion.

Moreover, the first shape region Q1 disposed in a wavy shape can include an outer circumference surface OCP and an inner circumference surface ICP, which are formed in a bent region. A compressed tensile force can be generated in the outer circumference surface OCP of the first shape region Q1, and thus, a stress can be in the outer circumference surface OCP of the connection line 500. The stress can cause a crack to occur along the outer circumference surface OCP of the connection line 500. The crack can increase the breakdown or resistance of the connection line 500, causing a reduction in total reliability of the display panel 100.

Therefore, in the stretchable display apparatus 1000 according to an embodiment of the present disclosure, the second reduction pattern 720 for reducing a stress occurring along the outer circumference surface OCP of the connection line 500 can be disposed in a shape corresponding to the outer circumference surface OCP of the first shape region Q1. In other words, because the second reduction pattern 720 is disposed in a shape corresponding to the outer circumference surface OCP of the first shape region Q1, the second reduction pattern 720 can be formed in a wavy shape or a curved shape. For example, the second reduction pattern 720 can act as a type of strengthening rib that can dissipate the stress or force caused by stretching along a larger area of the connection line 500, thus helping to relieve any pressure points or prevent cracks from forming in the connection line 500 as it is bent or stretched.

In the first shape region Q1 of the connection pattern 500, the second reduction pattern 720 can be disposed apart from the connection pattern 500 by the first interval D1. The first interval D1 can be within a range of about 0.01 μm to about 4 μm (e.g., 2 μm). The first interval D1 can be a space for absorbing a stress occurring in the outer circumference surface OCP of the connection line 500. When the first interval D1 is less than about 0.01 μm, the connection line 500 can be disposed adjacent to the first reduction pattern 710, and thus, an efficiency of transferring a stress of the connection line 500 to the second reduction pattern 720 may be reduced. When the first interval D1 is more than about 4 μm, a separation distance between the second reduction pattern 720 and the connection line 500 can increase, and thus, the second reduction pattern 720 may not easily absorb a stress of the connection line 500.

Moreover, in the stretchable display apparatus 1000 according to an embodiment of the present disclosure, the third reduction pattern 730 for reducing a stress occurring along the inner circumference surface ICP of the connection line 500 can be disposed on the inner circumference surface ICP of the first shape region Q1.

The third reduction pattern 730 can be formed as an island-shaped pattern along the inner circumference surface ICP of the first shape region Q1. As another example, the third reduction pattern 730 can be disposed in one shape selected from among an oval pattern, a semicircular pattern, a circular pattern, a line pattern, a rectangular pattern, a triangular pattern, and a combination shape thereof. As another example, the third reduction pattern 730 can be connected to the second reduction pattern 720.

In the inner circumference surface ICP of the first shape region Q1 of the connection pattern 500 and the third reduction pattern 730 can be spaced apart from each other by a second interval D2. The second interval D2 can be within a range of about 0.01 μm to about 4 μm (e.g., 2 μm). The second interval D2 can be a space for absorbing a stress occurring in the inner circumference surface ICP of the connection line 500. When the second interval D2 is less than about 0.01 μm, the connection line 500 can be disposed adjacent to the first reduction pattern 710, and thus, an efficiency of transferring a stress of the connection line 500 to the third reduction pattern 730 may be reduced. When the second interval D2 is more than about 4 μm, a separation distance between the third reduction pattern 730 and the connection line 500 can increase, and thus, the third reduction pattern 730 may not easily absorb a stress of the connection line 500.

The reduction pattern 700 including the first, second and third reduction patterns 710, 720 and 730 can include at least one material selected from among PI-based resin, epoxy-based resin, and a compound thereof each having a flexible characteristic which is the same as or similar to that of the base substrate 111.

The reduction pattern 700 including the first, second and third reduction patterns 710, 720 and 730 can include the same material, and thus, even without an additional process, cracks occurring in the outer circumference surface OCP and the inner circumference surface ICP of the first shape region Q1, which is wavy or curved, of the connection pattern 500 can be minimized.

Therefore, the reduction pattern 700 of the stretchable display apparatus 1000 according to an embodiment of the present disclosure can prevent or minimize a crack occurring in the connection line 500 when the base substrate 111 is bent, stretched, or contracted, thereby enhancing the reliability of the display panel 100.

In the stretchable display apparatus 1000 according to an embodiment of the present disclosure, the base substrate 111 having a flexible characteristic can be disposed under the plurality of pixel substrates 115.

Therefore, a region, other than a region overlapping the plurality of pixel substrates 115, of the base substrate 111 can be easily stretched or bent, and thus, the stretchable display apparatus 1000 can be implemented.

Moreover, transistors and organic light emitting devices disposed on the plurality of pixel substrates 115 which are rigid substrates can be prevented from being damaged when the stretchable display apparatus 1000 is bent or stretched.

Hereinafter, a subpixel structure SPX of the stretchable display apparatus 1000 according to the present disclosure will be described in more detail.

Figure 6:
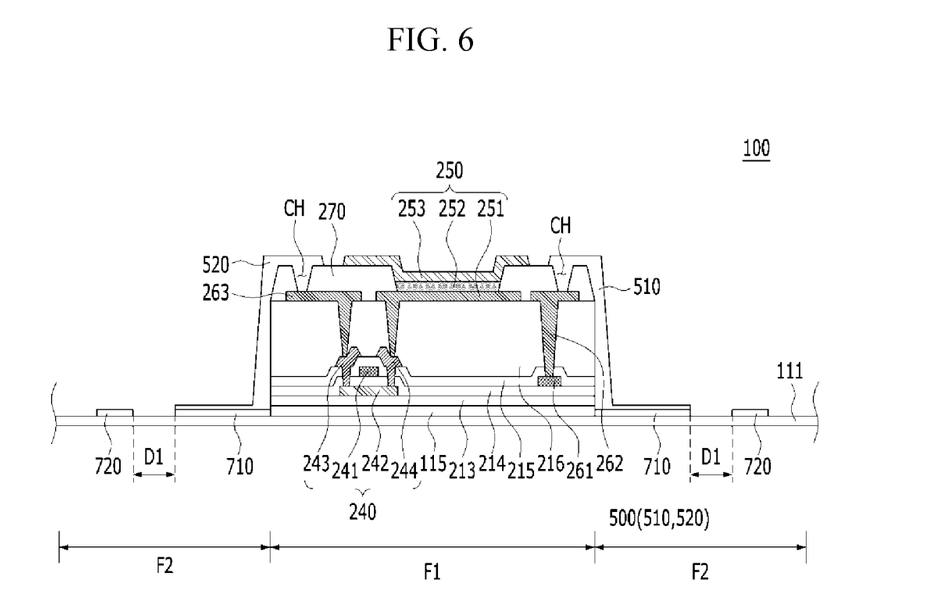
FIG. 6 is a cross-sectional view schematically illustrating an example of a subpixel structure of a stretchable display apparatus according to another embodiment of the present disclosure.

FIG. 6 is a cross-sectional view schematically illustrating an example of a subpixel structure of a stretchable display apparatus 1000 according to an embodiment of the present disclosure.

Referring to FIG. 6, in the stretchable display apparatus 1000 according to an embodiment of the present disclosure, a plurality of pixel substrates 115 can be disposed in a first region F1 of a base substrate 111, and a buffer layer 213 can be disposed on the pixel substrate 115.

The buffer layer 213 can be disposed on the plurality of pixel substrates 115 to protect various elements of the stretchable display apparatus 1000 from the penetration of oxygen and water from the outside.

The buffer layer 213 can include an insulating material, and for example, can be formed of a single layer or a multilayer including an organic layer including silicon nitride (SiNx), silicon oxide (SiOx), or silicon oxynitride (SiON).

Here, the buffer layer 213 can be formed in only a region overlapping the plurality of pixel substrates 115. As described above, the buffer layer 213 can include an organic material, and due to this, a crack can easily occur in a process of elongating the stretchable display apparatus 1000, causing damage. Accordingly, the buffer layer 213 may not be formed in a region between the plurality of pixel substrates 115, and can be patterned similar to a shape of the plurality of pixel substrates 115 and thus can be formed on only the plurality of pixel substrates 115 (e.g., the buffer layer 213 can be partitioned in a grid pattern corresponding to the plurality of pixel substrates 115).

Therefore, in the stretchable display apparatus 1000 according to an embodiment of the present disclosure, the buffer layer 213 can be formed in only a region overlapping the plurality of pixel substrates 115 which are rigid substrates, and thus, even when deformation such as the bending or stretching of the stretchable display apparatus 1000 occurs, the damage of the buffer layer 113 can be prevented.

As another example, the buffer layer 213 disposed in the first region F1, which is ridged, can include a material selected from among silicon rubber including polydimethylsiloxane (PDMS), elastomer including polyurethane (PU), and a compound thereof.

When a large Young's modulus difference exists between the second region F2, which is stretchable, and the first region F1, which is ridged, the pixel substrate 115 may be detached from the base substrate 111. Accordingly, when a material having a flexible characteristic is applied to the buffer layer 213, a stress can widely spread in the first region F1, which is ridged. In other words, when a material having a flexible characteristic is applied to the buffer layer 213, a reduced amount of stress can occur in the first region F1, which is ridged, thereby protecting a transistor (TFT, 240) characteristic.

The transistor 240 including a gate electrode 241, an active layer 242, a source electrode 243, and a drain electrode 244 can be formed on the buffer layer 213. To describe a process of forming the transistor 240, for example, the active layer 242 can be formed on the buffer layer 213, and a gate insulation layer 214 for insulating the active layer 242 from the gate electrode 241 can be formed on the active layer 242. An interlayer insulation layer 215 for insulating the gate electrode 241, the source electrode 243, and the drain electrode 244 can be formed, and the source electrode 243 and the drain electrode 244 each contacting the active layer 242 can be formed on the interlayer insulation layer 215.

Moreover, the gate insulation layer 214 and the interlayer insulation layer 215 can be patterned and can be formed in only a region overlapping the plurality of pixel substrates 115. The gate insulation layer 214 and the interlayer insulation layer 215 can also include the same inorganic material as that of the buffer layer 213, and thus, a crack may easily occur in a process of elongating the stretchable display apparatus 100, causing damage.

Therefore, the gate insulation layer 214 and the interlayer insulation layer 215 may not be formed in a region (e.g., the second region F2) between the plurality of pixel substrates 115, and moreover, can be patterned similar to a shape of the plurality of pixel substrates 115 and can be formed on only the plurality of pixel substrates 115. In other words, the areas in second region F2 are allowed to move more freely when the stretchable display apparatus 1000 is stretched, while the areas in first region F1 experience less stretching, and thus less force, which helps prevent cracks or disconnections.

In FIG. 6, for convenience of description, only a driving transistor among various transistors included in the stretchable display apparatus 1000 is illustrated, but a switching transistor, a capacitor, and the like can be included in the stretchable display apparatus 1000. Also, in the specification, the transistor 240 is described as having a coplanar structure, but is not limited thereto and various transistors having a staggered structure can be used.

A gate line 261 can be disposed on the gate insulation layer 214. The gate line 261 can be a line for transferring a gate signal to the plurality of subpixels SPX. The gate line 216 can include the same material as that of the gate electrode 241, but is not limited thereto. In other words, the gate line 261 and the gate electrode 241 can be formed as one body.

A planarization layer 216 can be formed on the transistor 240 and the interlayer insulation layer 215. The planarization layer 216 can planarize an upper portion of the transistor 240. The planarization layer 216 can include a single layer or a plurality of layers and can include an organic material. For example, the planarization layer 216 can include an acrylic organic material, but is not limited thereto.

The planarization layer 216 can include a contact hole for electrically connecting the transistor 240 to an anode 251, a contact hole for electrically connecting a data line pad 263 to the source electrode 243, and a contact hole for electrically connecting the gate line 261 to a gate line pad 262.

A passivation layer can be formed between the transistor 240 and the planarization layer 216. That is, the passivation layer covering the transistor 240 can be formed for protecting the transistor 240 from the penetration of water and oxygen. The passivation layer can include an inorganic material and can include a single layer or a multilayer, but is not limited thereto.

The data line pad 263, the gate line pad 262, and an organic light emitting device 250 can be disposed.

The data line pad 263 can transfer a data signal, supplied through the connection line 500 acting as a data line, to the plurality of subpixels SPX. In detail, the data line pad 263 can be connected to the second connection line 520.

The data line pad 263 can be connected to the source electrode 243 of the transistor 240 through a contact hole formed in the planarization layer 216. In other words, in the first region F1, a data line can be formed as one body with the source electrode 243, and thus, can not be referred to by a separate reference numeral. The data line pad 263 can include the same material as that of the anode 251 of the organic light emitting device 250, but is not limited thereto.

Moreover, the data line pad 263 can be formed on the interlayer insulation layer 215 instead of the planarization layer 216 and can include the same material as that of each of the source electrode 243 and the drain electrode 244 of the transistor 240.

The gate line pad 262 can transfer a gate signal, supplied through the connection line 500 acting as the gate line 261, to the plurality of subpixels SPX. In detail, the gate line pad 262 can be connected to the first connection line 510.

The gate line pad 262 can be connected to the gate line 261 through a contact hole which is formed in the planarization layer 216 and the interlayer insulation layer 215 and can transfer the gate signal to the gate line pad 262.

The gate line pad 262 can include the same material as that of the data line pad 263, but is not limited thereto.

A first reduction pattern 710 can be disposed in or under the first connection line 510 and the second reduction line 520. In terms of a plane of the second region F2, the first reduction pattern 710 can be formed to have the same width as that of the first connection line 510 and the second connection line 520.

Also, the first reduction pattern 710 can directly contact a side surface of the pixel substrate 115. Here, the first reduction pattern 710 can be formed to have the same thickness as that of the pixel substrate 115, or can be formed to have a thickness which is less than that of the pixel substrate 115. In the drawing, it is illustrated that the first reduction pattern 710 is formed to have a thickness which is less than that of the pixel substrate 115.

Moreover, the connection line 500 disposed to overlap the first reduction pattern 710 can be spaced apart from a second reduction pattern 720 by a first interval D1, or can be spaced apart from a third reduction pattern 730 by a second interval D2. In the drawing, it is illustrated that the second reduction pattern 730 is disposed, but the third reduction pattern 730 can be disposed in a direction of a cross-sectional surface. In a situation where the third reduction pattern 730 is disposed adjacent to the first reduction pattern 710, the third reduction pattern 730 can be spaced apart from the first reduction pattern 710 by a separation distance corresponding to the second interval D2. For example, the first reduction pattern 710 can be disposed between the second reduction pattern 720 and the third reduction pattern 730, and each of the first, second and third reduction patterns 710, 720 and 730 can be spaced apart from each other.

The organic light emitting device 250 can be an element which is disposed to correspond to each of the plurality of subpixels SPX and emits light having a specific wavelength band. That is, the organic light emitting device 250 can be a blue organic light emitting device emitting blue light, a red organic light emitting device emitting red light, a green organic light emitting device emitting green light, or a white organic light emitting device emitting white light, but is not limited thereto. When the organic light emitting device 250 is a white organic light emitting device, the stretchable display apparatus 1000 can further include a color filter.

The organic light emitting device 250 can include an anode 251, an organic light emitting layer 252, and a cathode 253. In detail, the anode 251 can be disposed on the planarization layer 216. The anode 251 can be an electrode which is configured to supply a hole to the organic light emitting layer 252. The anode 251 can include a transparent conductive material having a high work function. Here, the transparent conductive material can include indium tin oxide (ITO), indium zinc oxide (IZO), and indium tin zinc oxide (ITZO).

The anode 251 can include the same material as that of each of the gate line pad 261 and the data line pad 263 disposed on the planarization layer 216, but is not limited thereto.

Moreover, in a situation where the stretchable display apparatus 1000 is implemented as a top emission type, the anode 251 can further include a reflector.

The anode 251 can be spaced apart from another anode for each subpixel SPX and can be electrically connected to the transistor 240 through a contact hole of the planarization layer 216. For example, in FIG. 6, the anode 251 is illustrated as being electrically connected to the drain electrode 214 of the transistor 240, but can be electrically connected to the source electrode 243.

A bank 270 can be formed on the anode 251, the data line pad 263, the gate line pad 262, and the planarization layer 216. The bank 270 can be an element which divides adjacent subpixels SPX.

The bank 270 can be disposed to cover at least a portion of each of both sides of an adjacent anode 251 and can expose a portion of a top surface of the anode 251. The bank 270 can solve a problem where the subpixel SPX emits undesired light or colors are mixed because light is emitted in a lateral direction of the anode 251 due to the concentration of a current on a corner of the anode 251. The bank 270 can include acrylic resin, benzocyclobutene (BCB)-based resin, or polyimide, but is not limited thereto.

The bank 270 can include a contact hole CH, connecting the data line pad 263 to the second connection line 520 acting as a data line, and a contact hole CH connecting the gate line pad 262 to the first connection line 510 acting as a gate line. Therefore, the data line pad 263 exposed at the contact hole CH can be disposed on the bank 270, and the first connection line 510 and the second connection line 520 can be respectively disposed on the data line pad 263 and the gate line pad 262.

The connection line 500 including the first connection line 510 and the second connection line 520 can be formed to contact a top surface and a side surface of the bank 270 disposed on the pixel substrate 115, the planarization layer 216, the interlayer insulation layer 215, the gate insulation layer 214, the buffer layer 214, and side surfaces of the plurality of pixel substrates 115 and to extend to a top surface of the first reduction pattern 710.

Moreover, the connection line 500 can contact the line pads 262 and 263 (e.g., in detail, the data line pad 263 and the gate line pad 262) on the pixel substrate 115 closest thereto among the plurality of pixel substrates 115.

The organic light emitting layer 252 can be disposed on the anode 251. The organic light emitting layer 252 can be configured to emit light. The organic light emitting layer 252 can include a light emitting material, and the light emitting material can include a phosphorescent material or a fluorescent material. However, the present disclosure is not limited thereto.

The organic light emitting layer 252 can include one light emitting layer. Alternatively, the organic light emitting layer 252 can have a stack structure where a plurality of light emitting layers are stacked with a charge generating layer disposed therebetween. Also, the organic light emitting layer 252 can further include at least one organic layer of a hole transporting layer, an electron transporting layer, a hole blocking layer, an electron blocking layer, a hole injecting layer, and an electron injecting layer.

The cathode 253 can be disposed on the organic light emitting layer 252. The cathode 253 can supply an electron to the organic light emitting layer 252. The cathode 253 can include transparent conductive oxide, such as ITO, IZO, ITZO, zinc oxide (ZnO), or tin oxide (TO), or an ytterbium (Yb) alloy. Alternatively, the cathode 153 can include a metal material.

The cathode 253 can be patterned and formed to overlap each of the plurality of pixel substrates 115. That is, the cathode 253 can be formed in only a region overlapping the plurality of pixel substrates 115 and may not to be disposed in a region between the plurality of pixel substrates 115. The cathode 253 can include a material such as transparent conductive oxide or a metal material, and thus, in a situation where the cathode 253 is formed between the plurality of pixel substrates 115, the cathode 253 may be damaged in a process of contracting and stretching the stretchable display apparatus 1000.

Therefore, in terms of a plane, the cathode 253 can be formed to correspond to each of the plurality of pixel substrates 115. The cathode 253 can be formed to have an area which does not overlap a region, where the connection line 500 is disposed, of a region overlapping the plurality of pixel substrates 115.

Unlike general organic light emitting display apparatuses, in the stretchable display apparatus 1000 according to an embodiment of the present disclosure, the cathode 253 can be patterned and formed to correspond to the plurality of pixel substrates 115. Therefore, each of a plurality of cathodes 253 disposed on the plurality of pixel substrates 115 can be independently supplied with a low level power through the connection line 500. This can denote that light for implementing an input image can be provided at a position corresponding to the pixel substrate 115.

As described above, when the base substrate 111 is bent, stretched, or contracted, the reduction pattern 700 of the stretchable display apparatus 1000 according to an embodiment of the present disclosure can prevent or minimize a crack occurring in the connection line 500, thereby enhancing the reliability of the display panel 100.

Therefore, in the stretchable display apparatus 1000 according to an embodiment of the present disclosure, the reduction pattern 700 can be disposed adjacent to the connection line 500 that is electrically connecting the plurality of pixel substrates 115, thereby reducing a stress occurring in a curved region of the connection line 500.

Moreover, in the stretchable display apparatus 1000 according to an embodiment of the present disclosure, a flexible characteristic can be secured by using the reduction pattern 700 disposed adjacent to the connection line 500, and a crack of the connection line 500 can be prevented, thereby enhancing the reliability of the display panel.

Figure 7:
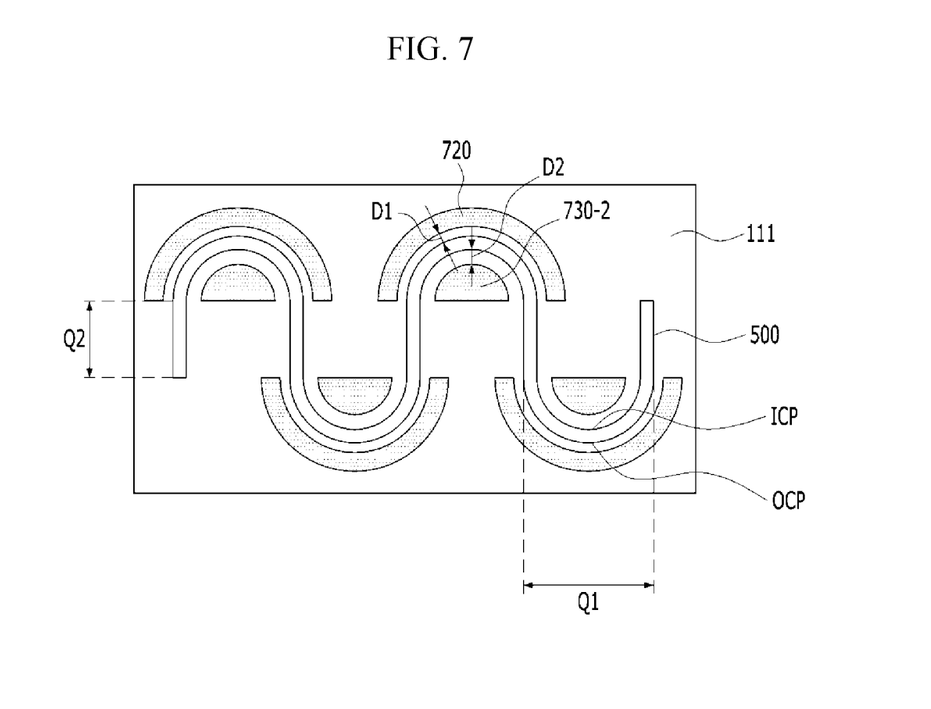
FIG. 7 is a plan view illustrating a shape of a third reduction pattern of a stretchable display apparatus according to another embodiment of the present disclosure.
Figure 8:
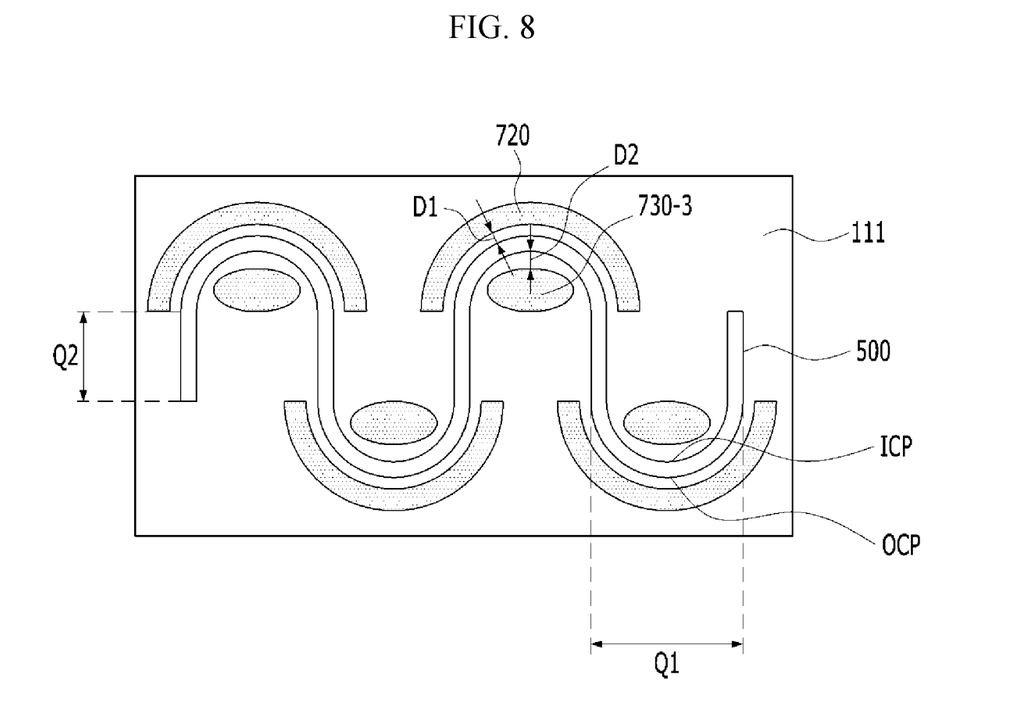
FIG. 8 is a plan view illustrating a shape of a third reduction pattern of a stretchable display apparatus according to another embodiment of the present disclosure.

FIG. 7 is a plan view illustrating a shape of a third reduction pattern of a stretchable display apparatus according to another embodiment of the present disclosure, and FIG. 8 is a plan view illustrating a shape of a third reduction pattern of a stretchable display apparatus 1000 according to another embodiment of the present disclosure.

In describing FIGS. 7 and 8, repetitive descriptions are omitted, and for convenience of description, the following descriptions will be given with reference to FIGS. 7 and 8 in conjunction with FIGS. 1 to 6.

Referring to FIGS. 7 and 8, the stretchable display apparatus 1000 according to an embodiment of the present disclosure can include a plurality of third reduction patterns 730-2 and 730-3, and the third reduction patterns 730-2 and 730-3 can be formed in a semicircular shape or an oval shape.

The third reduction pattern 730-2 having an island pattern and a semicircular shape and the third reduction pattern 730-3 having an island pattern and an oval shape can be formed along an inner circumference surface ICP of a connection line 500 and can reduce a stress of a first shape region Q1.

In a situation where a third reduction pattern 730 is formed in a line shape or a dot shape of an island pattern, a structure corresponding to a shape of the inner circumference surface ICP of the connection line 500 may not be implemented, and thus, some stresses occurring in an inner circumference surface ICP of the first shape region Q1 can be transferred to a peripheral region. However, in a situation where the third reduction pattern 730-3 is formed in a shape corresponding to the inner circumference surface ICP of the first shape region Q1, the third reduction pattern 730-2 having a semicircular shape and the third reduction pattern 730-3 having an oval shape can efficiently reduce a stress occurring in the inner circumference surface ICP. For example, the shapes of the third reduction patterns 730-2 and 730-3 can efficiently distribute a stress due to stretching along a larger area of the curved portion of the connection line 500, thus reducing the amount of stress experienced at any one individual spot on the connection line 500, which helps prevent cracking.

Therefore, in the stretchable display apparatus 1000 according to an embodiment of the present disclosure, the reduction pattern 730 can be disposed adjacent to the connection line 500 electrically connecting a plurality of pixel substrates 115, and particularly, the third reduction pattern 730-2 having a semicircular shape and the third reduction pattern 730-3 having an oval shape can be disposed along the inner circumference surface ICP, thereby reducing a stress occurring in a curve region of the connection line 500.

Moreover, in the stretchable display apparatus 1000 according to an embodiment of the present disclosure, a flexible characteristic can be secured by using the reduction pattern 730 disposed adjacent to the connection line 500 (particularly, the third reduction pattern 730-2 having a semicircular shape and the third reduction pattern 730-3 having an oval shape), and a crack of the connection line 500 can be prevented, thereby enhancing the reliability of the display panel 100.

Therefore, when the base substrate 111 is bent, stretched, or contracted, the reduction pattern 730 of the stretchable display apparatus 1000 according to an embodiment of the present disclosure can minimize a crack occurring in the connection line 500, thereby enhancing the reliability of the display panel 100.

Figure 9:
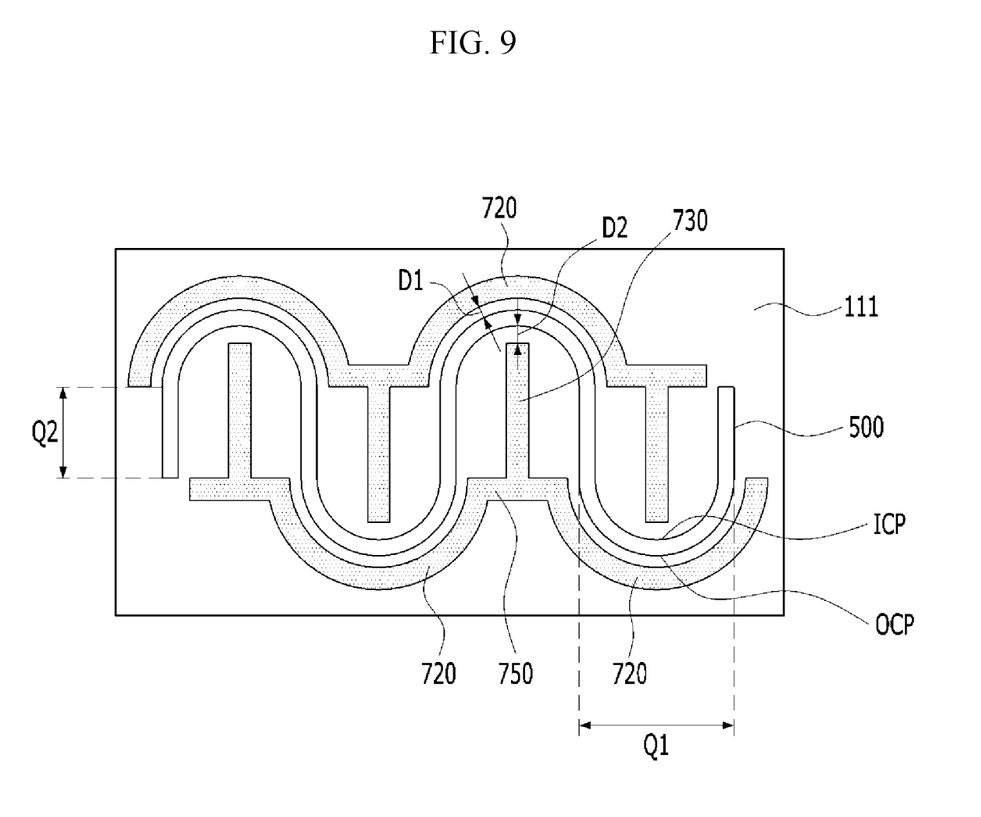
FIG. 9 is a plan view illustrating a shape of a third reduction pattern of a stretchable display apparatus according to another embodiment of the present disclosure.

FIG. 9 is a plan view illustrating a shape of a third reduction pattern of a stretchable display apparatus 1000 according to another embodiment of the present disclosure.

In describing FIG. 9, repetitive descriptions are omitted, and for convenience of description, the following descriptions will be given with reference to FIG. 9 in conjunction with FIGS. 1 to 6.

Referring to FIG. 9, the stretchable display apparatus 1000 according to another embodiment of the present disclosure can include a reduction pattern 700, and the reduction pattern 700 can include a second reduction pattern 720, a third reduction pattern 730, and a connection pattern 750 connecting the second reduction pattern 720 to the third reduction pattern 730.

The third reduction pattern 730 can be formed to have a line-shaped pattern along a second shape region Q2. Here, the third reduction pattern 730 is not limited to a line shape and a plurality of third reduction patterns 730 can be disposed along the second shape region Q2. Alternatively, as in FIGS. 7 and 8, the third reduction pattern 730 can be formed in an oval shape, and particularly, the third reduction pattern 730-3 having an oval shape of FIG. 8 can be disposed in a 90-degree-rotated direction.

One side of an end portion of the third reduction pattern 730 can be disposed adjacent to an inner circumference surface ICP of a first shape region Q1, and the other side of the end portion of the third reduction pattern 730 can be disposed adjacent to an end portion of a second shape region Q2.

An end portion of the other side of the third reduction pattern 730 can be connected to the connection pattern 750 and end portions of one side and the other side of the connection pattern 750 can connect end portions of a plurality of second reduction patterns 720, and thus, the connection pattern 750 can connect the second reduction pattern 720 to the third reduction pattern 730.

The connection pattern 750 can be disposed at a portion (e.g., a boundary portion) at which the first shape region Q1 of a connection line 500 is connected to the second shape region Q2 of the connection line 500. Accordingly, the connection pattern 750 for reducing a stress can be formed up to a boundary portion of the first shape region Q1, thereby reducing a stress occurring in a curve region of the connection line 500.

Therefore, in the stretchable display apparatus 1000 according to another embodiment of the present disclosure, the reduction pattern 700 can be disposed adjacent to the connection line 500 electrically connecting a plurality of pixel substrates 115, and particularly, the connection pattern 750 connecting the third reduction pattern 730 to the second reduction pattern 720 can be further disposed, thereby reducing a stress occurring in a curved region of the connection line 500.

Moreover, in the stretchable display apparatus 1000 according to another embodiment of the present disclosure, a flexible characteristic can be secured by using the reduction pattern 700 disposed adjacent to the connection line 500 (e.g., the connection pattern 750 connecting the third reduction pattern 730 to the third reduction pattern 720), and a crack of the connection line 500 can be prevented, thereby enhancing the reliability of the display panel 100.

Therefore, when a base substrate 111 is bent, stretched, or contracted, the reduction pattern 730 of the stretchable display apparatus 1000 according to another embodiment of the present disclosure can minimize a crack occurring in the connection line 500, thereby enhancing the reliability of the display panel 100. Also, the reduction pattern 700 can help the display apparatus 1000 reliably and safely stretch and return to its original shape after stretching.

While the present disclosure has been particularly shown and described with reference to exemplary embodiments thereof, it will be understood by those of ordinary skill in the art that various changes in form and details can be made therein without departing from the spirit and scope of the present disclosure as defined by the following claims.

The invention claimed is:

1. A stretchable display apparatus comprising:
   a transistor substrate including:
      a plurality of first regions corresponding to a plurality of pixel substrates disposed on a base substrate, and
      a second region between the plurality of first regions;
   a connection line disposed in the second region, the connection line electrically connecting two adjacent pixel substrates among the plurality of pixel substrates; and
   a reduction pattern disposed in the second region,
   wherein the reduction pattern comprises:
      a first reduction pattern overlapping with the connection line; and
      a second reduction pattern spaced apart from the first reduction pattern by a first distance and having a shape corresponding to at least a portion of the connection line.

2. The stretchable display apparatus of claim 1, wherein the connection line includes a curved portion and a straight portion, and
   wherein the second reduction pattern includes a curved portion corresponding to an circumference of the curved portion of the connection line, and the second reduction pattern is spaced apart from the connection line.

3. The stretchable display apparatus of claim 2, wherein the reduction pattern further comprises:
   a third reduction pattern disposed in the second region and corresponding to an inner circumference of the curved portion of the connection line, the third reduction pattern being spaced apart from the connection line.

4. The stretchable display apparatus of claim 3, wherein the third reduction pattern is disposed in one shape selected from among an oval pattern, a semicircular pattern, a line pattern, and a combination shape thereof, the third reduction pattern having an island shape disposed adjacent to the inner circumference of the curved portion of the connection line.

5. The stretchable display apparatus of claim 3, wherein the first reduction pattern, the second reduction pattern and the third reduction pattern include a same material.

6. The stretchable display apparatus of claim 3, wherein the second reduction pattern further comprises a connection pattern connecting the second reduction pattern to the third reduction pattern.

7. The stretchable display apparatus of claim 6, wherein a first end portion of the third reduction pattern is disposed adjacent to the inner circumference of the curved portion of the connection line, and a second end portion of the third reduction pattern is disposed adjacent to a boundary area located between the straight portion of the connection line and the curved portion of the connection line,
wherein the second end portion of the third reduction pattern is connected to the connection pattern, and
wherein the connection pattern is connected between two second reduction patterns.

8. The stretchable display apparatus of claim 1, wherein the first reduction pattern contacts a side surface of a corresponding pixel substrate among the plurality of pixel substrates.

9. The stretchable display apparatus of claim 1, wherein the first reduction pattern has a thickness less than or equal to a thickness of each of the plurality of pixel substrates.

10. The stretchable display apparatus of claim 1, wherein the reduction pattern comprises one material selected from among polyimide (PI)-based resin, epoxy-based resin, and a compound thereof each having a same flexibility as the base substrate.

11. The stretchable display apparatus of claim 1, wherein the first distance is about 0.01 µm to about 4 µm.

12. The stretchable display apparatus of claim 3, wherein the third reduction pattern is spaced apart from the connection line by a second distance, and the second distance is about 0.01 µm to about 4 µm.

13. The stretchable display apparatus of claim 1, wherein the connection line is provided in plurality, and the first reduction pattern is provided in plurality and disposed to correspond to the plurality of connection lines.

14. The stretchable display apparatus of claim 1, wherein the transistor substrate comprises:
a plurality of pixel substrates disposed in only in the plurality of first regions of the base substrate, each of the plurality of pixel substrates having a rigidity that is greater than a rigidity of the base substrate;
a buffer layer disposed on each of the plurality of pixel substrates;
a transistor including:
a gate electrode disposed on the buffer layer, a gate line provided as one body with the gate electrode,
a gate insulation layer disposed on the gate electrode,
an active layer disposed on the gate insulation layer,
an interlayer insulation layer disposed on the active layer,
a source/drain electrode disposed on the interlayer insulation layer,
a data line provided as one body with the source/drain electrode, and
a planarization layer disposed on the source/drain electrode and the data line;
a data line pad and a gate line pad disposed on the planarization layer and respectively connected to the data line and the gate line; and
an organic light emitting device connected to the transistor, and wherein the connection line comprises:
a first connection line connected to the gate line pad to travel in a firstwidthwise direction of the plurality of pixel substrates; and
a second connection line connected to the data line pad to travel in a second direction of the plurality of pixel substrates, the second direction being different than the first direction.

15. The stretchable display apparatus of claim 14, wherein the buffer layer comprises one material selected from among silicon rubber including polydimethylsiloxane (PDMS), elastomer including polyurethane (PU), and a compound thereof.

16. The stretchable display apparatus of claim 14, wherein the organic light emitting device comprises:
an anode connected to the transistor and disposed on the planarization layer;
a bank including an opening portion exposing a portion of the anode and a contact hole exposing a portion of each of the data line pad and the gate line pad;
an organic light emitting layer disposed on the anode exposed by the bank; and
a cathode disposed on the organic light emitting layer, and
wherein the first connection line and the second connection line, respectively connected to the gate line pad and the data line pad each exposed through the contact hole, are disposed on the bank.

17. The stretchable display apparatus of claim 16, wherein the gate line pad, the data line pad, and the anode comprise a same material.

18. The stretchable display apparatus of claim 16, wherein the first connection line and the second connection line contact a top surface of the bank and a side surface of the bank, a portion of the planarization layer, a portion of the interlayer insulation layer, a portion of the gate insulation layer, a portion of the buffer layer, and side surfaces of the plurality of pixel substrates, and
wherein the first connection line and the second connection line extend to a top surface of the first reduction pattern.

19. The stretchable display apparatus of claim 1, wherein the plurality of pixel substrates are disposed on the base substrate in a grid arrangement, and the plurality of pixel substrates are spaced apart from each other.

20. A stretchable display apparatus comprising:
a plurality of pixel substrates disposed on a base substrate and being separated from each other;
a connection line disposed between two adjacent pixel substrates among the plurality of pixel substrates; and
a reduction pattern disposed between the two adjacent pixel substrates and spaced apart from the connection line,
wherein the reduction pattern comprises:
a first reduction pattern overlapping with the connection line; and
a second reduction pattern spaced apart from the first reduction pattern by a first distance.

\* \* \* \* \*